United States Patent
Mark et al.

(10) Patent No.: US 7,124,338 B1
(45) Date of Patent: Oct. 17, 2006

(54) METHODS OF TESTING INTERCONNECT LINES IN PROGRAMMABLE LOGIC DEVICES USING PARTIAL RECONFIGURATION

(75) Inventors: David Mark, San Jose, CA (US); Randy J. Simmons, San Jose, CA (US); Huy-Quang Le, Milpitas, CA (US); Kazi S. Afzal, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 567 days.

(21) Appl. No.: 10/683,919

(22) Filed: Oct. 10, 2003

(51) Int. Cl.
  *G01R 31/28* (2006.01)
  *G06F 7/38* (2006.01)

(52) U.S. Cl. ........................... 714/725; 326/38

(58) Field of Classification Search ............... 714/725; 716/16, 17; 326/37–39
See application file for complete search history.

(56) References Cited

U.S. PATENT DOCUMENTS

| | | | | |
|---|---|---|---|---|
| 5,794,062 A * | 8/1998 | Baxter | .............. | 712/30 |
| 5,914,616 A | 6/1999 | Young et al. | | |
| 6,058,469 A * | 5/2000 | Baxter | .............. | 712/43 |
| 6,278,290 B1 * | 8/2001 | Young | .............. | 326/41 |
| 6,507,211 B1 * | 1/2003 | Schultz et al. | .............. | 326/37 |
| 6,573,748 B1 * | 6/2003 | Trimberger | .............. | 326/38 |

OTHER PUBLICATIONS

Xilinx, Inc.; "The Programmable Logic Data Book 2000"; published Apr. 2000; available from Xilinx, Inc., 2100 Logic Drive, San Jose, California 95124; pp. 3-75 through 3-96.

Xilinx, Inc.; XAPP290 v1.0 Application Note; "Two Flows for Partial Reconfiguration: Module Based or Small Bit Manipulations"; published May 17, 2002; available from Xilinx, Inc., 2100 Logic Drive, San Jose, California 95124; 23 pages.

* cited by examiner

*Primary Examiner*—Emmanuel L. Moise
*Assistant Examiner*—Cynthia Britt
(74) *Attorney, Agent, or Firm*—Lois D. Cartier

(57) ABSTRACT

Methods and systems for testing PLD interconnect lines, e.g., interconnect lines driven by a plurality of programmable buffers. Each programmable buffer has an associated memory element. The memory elements are configured to form a shift register, with one of the buffers and the interconnect line inserted between two of the memory elements. The signal path through the shift register is tested using a first test pattern. Partial reconfiguration is then used to change the insertion point of the interconnect line in the signal path by changing the configuration of the interconnect structure and using a second one of the buffers. A second test pattern is then used to test the second buffer. This sequence is repeated until each of the buffers has been tested. Because only small changes are required, the partial reconfiguration requires loading only small amounts of configuration data, significantly reducing test time compared to presently-known test methods.

46 Claims, 9 Drawing Sheets

US 7,124,338 B1

METHODS OF TESTING INTERCONNECT LINES IN PROGRAMMABLE LOGIC DEVICES USING PARTIAL RECONFIGURATION

FIELD OF THE INVENTION

The invention relates to Programmable Logic Devices (PLDs). More particularly, the invention relates to methods of testing interconnect lines in PLDs.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLs, RAM, processors, and so forth).

The interconnect structure, CLBs, IOBs, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

One such FPGA, the Xilinx Virtex® FPGA, is described in detail in pages 3–75 through 3–96 of the Xilinx 2000 Data Book entitled "The Programmable Logic Data Book 2000", published April, 2000, available from Xilinx, Inc., 2100 Logic Drive, San Jose, Calif. 95124, which pages are incorporated herein by reference. (Xilinx, Inc., owner of the copyright, has no objection to copying these and any other pages referenced herein but otherwise reserves all copyright rights whatsoever.)

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

Because of the large number of possible configurations in a PLD, testing a large PLD can be a time-consuming task. Ideally, every programmable element in the device is tested. A typical method of testing an FPGA, for example, is to create a design and an associated test pattern that together test one or more specific programmable resources of the PLD. Another design and test pattern are created to test other resources, and so forth. The designs are then sequentially loaded into the FPGA and tested using the associated test patterns. Because an FPGA can include millions of programmable elements, a large number of test patterns can be required to perform a thorough test.

A PLD bitstream can include millions of bits. Therefore, the process of loading a configuration bitstream into a PLD can take a significant amount of time, particularly for the larger devices. Hence, repeating the configuration process a large number of times during the testing process can take an undesirably long time, long enough to significantly impact the cost of the PLD to consumers.

Therefore, it is desirable to find methods of testing the programmable elements of PLDs using a minimal amount of configuration time during the test sequence.

PLD interconnect structures typically include interconnect lines of various lengths and types. These interconnect lines are programmably interconnected to the logic blocks and to other interconnect lines using programmable interconnect points (PIPs). For example, two interconnect lines can be coupled together by enabling a CMOS pass gate (a simple PIP) that programmably interconnects the two lines. U.S. Pat. No. 5,914,616 describes in detail the interconnect structure of the Xilinx Virtex FPGAs, and is hereby incorporated herein by reference.

One useful type of interconnect line is an interconnect line driven by a large number of programmable buffers. In some FPGAs, these buffers can be tristated using a signal supplied by user logic. In others, the buffers can only be tristated by appropriately setting or resetting one or more configuration memory cells. In some architectures, the buffers can be tristated using either method. Some FPGAs include more than one type of programmable buffer. In all cases, using currently known methods, testing these buffers requires successively reconfiguring the PLD between each test pattern to enable each buffer in turn. As previously described, this process can add significantly to the time required to test the PLD.

Therefore, it is desirable to provide improved methods of testing interconnect lines in PLDs that minimize testing time. Further, it is desirable to provide improved methods of testing interconnect lines driven by large numbers of programmable buffers.

SUMMARY OF THE INVENTION

The present invention provides efficient methods and systems for testing PLD interconnect lines. In one embodiment, the PLD includes a source logic element, a destination logic element, and a plurality of interconnect lines programmably interconnecting the source and destination logic elements. The PLD is configured with a first configuration wherein a signal path is provided from an output terminal of the source logic element to an input terminal of the destination logic element via a first interconnect line. A test pattern is run on the PLD by providing a first test input signal to the source logic element and monitoring a resulting first test output signal from the destination logic element. The PLD is then partially reconfigured with a second configuration wherein the signal path is severed between the source logic element and the first interconnect line and between the first interconnect line and the destination logic element, and wherein programmable interconnections are added between the source logic element and a second interconnect line and between the second interconnect line and the destination logic element. A second test pattern is then run on the PLD by providing a second test input signal to the source logic element and monitoring a resulting second test output signal from the destination logic element.

In some embodiments, the partial reconfiguration is designed to include a minimum number of configuration data frames necessary to reroute the signal path through the second interconnect line instead of through the first interconnect line. In other embodiments, the partial reconfiguration is designed to include a minimum number of configuration data bits.

Because only small changes are required in the configured PLD, the partial reconfiguration requires loading only small amounts (e.g., a small number of frames) of configuration data. Therefore, the processes described herein can significantly reduce the test time required to test interconnect lines in a PLD, compared to presently-known test methods.

Some embodiments of the invention provide efficient methods and systems for testing PLD interconnect lines driven by a plurality of programmable buffers. Each programmable buffer has an associated memory element. The memory elements are configured to form a shift register, with one of the buffers and the interconnect line inserted between two of the memory elements. The signal path through the shift register is tested using a first test pattern. Partial reconfiguration is then used to change the insertion point of the interconnect line in the signal path by changing the configuration of the interconnect structure and using a second one of the buffers. A second test pattern is then used to test the second buffer. This sequence is repeated until each of the buffers has been tested.

The partial reconfiguration requires the loading of only small amounts of configuration data. For example, in some embodiments the memory elements need not be reconfigured, and the locations of the input and output terminals used for testing do not change.

The invention also encompasses systems including PLDs and testers coupled to test the PLDS, the testers including means for performing the described test methods.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of systems for testing programmable logic devices (PLDs). The present invention has been found to be particularly applicable and beneficial for test systems for field programmable gate arrays (FPGAs). While the present invention is not so limited, an appreciation of the present invention is now presented by way of a specific example of testing a presently-available FPGA.

Figure 1:
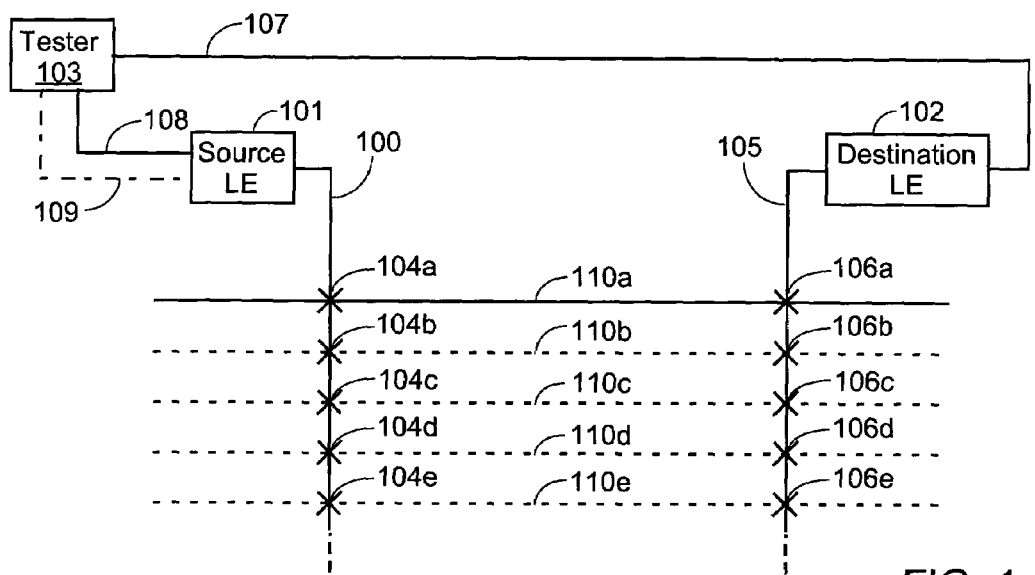
FIG. 1 illustrates a first configuration that can be programmed into a PLD as part of a novel test method.
Figure 2:
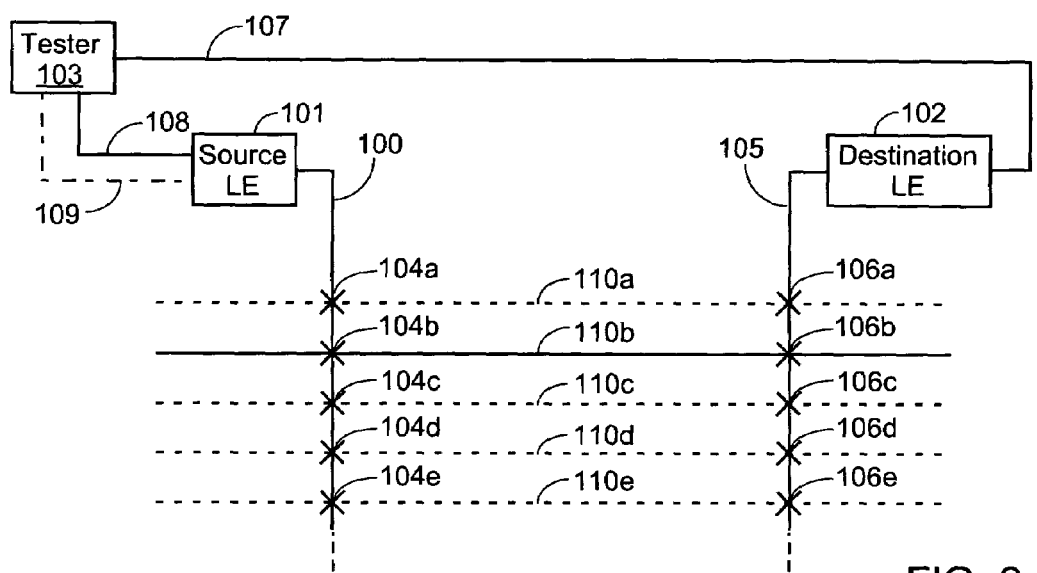
FIG. 2 illustrates a second configuration that can be programmed into a PLD as part of a novel test method.
Figure 3:
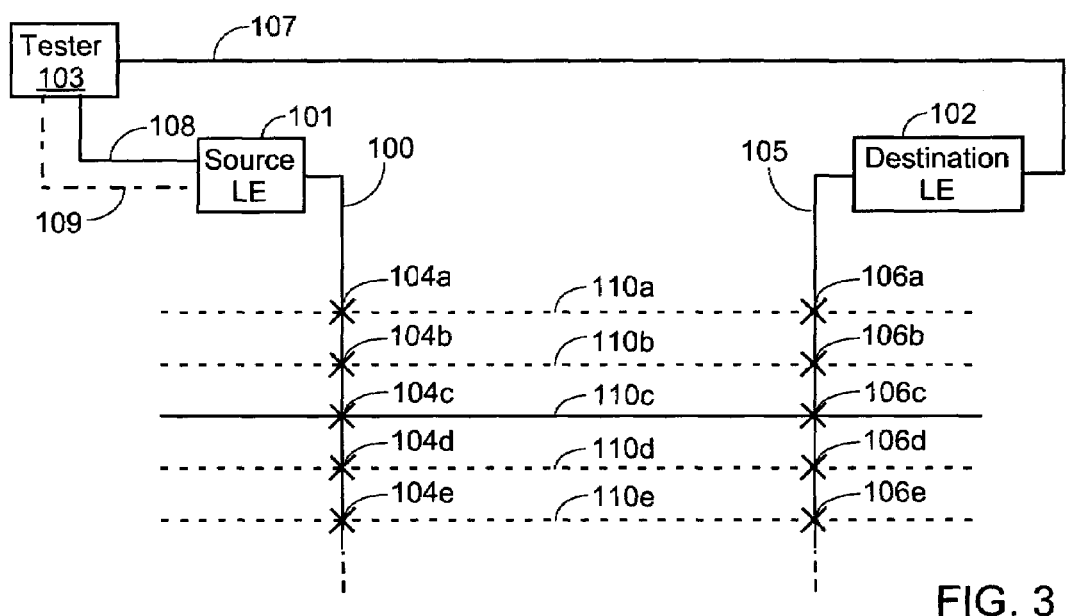
FIG. 3 illustrates a third configuration that can be programmed into a PLD as part of a novel test method.

FIGS. 1–3 illustrate a series of configurations that can be programmed into a PLD in accordance with a method of the present invention. A goal of the method is to test a series of interconnect lines, illustrated in FIGS. 1–3 as horizontal lines 110a–110e, as well as the programmable interconnect points (PIPs, 104a–104e and 106a–106e) providing access to and from interconnect lines 110a–110e.

FIG. 1 shows a first configuration programmed into the PLD, preferably by performing a full configuration of the PLD. A source logic element (LE 101) and a destination logic element (LE 102) can be, for example, flip-flops, buffers (e.g., clock buffers), or any other logic element. The two logic elements 101, 102 can be the same type of logic element or two different types. The logic elements can also be either programmable or non-programmable.

The two logic elements are interconnected by a signal path that traverses a first interconnect line 110a (shown as a solid line in FIG. 1), and also traverses interconnect lines 100 and 105 and two PIPs 104a and 106a, which allow access to and from interconnect line 110a, respectively. Interconnect lines 110b–110e are illustrated as dashed lines, indicating that they are not used in the illustrated configuration.

The system configuration shown in FIG. 1 also includes a tester 103, as well as interconnections from tester 103 to source logic element 101, and from destination logic element 102 to tester 103. Interconnections 108 and 109 can be, for example, data and an optional clock signal provided by the tester to source logic element 101. In some embodiments (not shown), for example where destination logic element 102 includes a flip-flop, optional clock signal 109 can also be provided to destination logic element 102. Interconnection 107 is an output signal provided by destination logic element 102 to tester 103. (In the present specification, the same reference characters are used to refer to terminals, signal lines, and their corresponding signals.)

Thus, the configuration shown in FIG. 1 provides a signal path through interconnect line 110a that can be tested by tester 103 using a first test pattern.

FIG. 2 illustrates a second configuration that can be created from the configuration of FIG. 1 by performing a partial reconfiguration in accordance with an embodiment of the present invention. The signal path of FIG. 1 has been severed between source logic element 101 and interconnect line 110a and between interconnect line 110a and destination logic element 102 (e.g., by disabling PIPs 104a and 106a). Programmable interconnections have also been added between source logic element 101 and interconnect line 110b and between interconnect line 110b and destination logic element 102 (e.g., by enabling PIPs 104b and 106b). Thus, the signal path now traverses interconnect line 110b instead of interconnect line 110a, as in FIG. 1. The new signal path can now be tested using a second test pattern.

Note that all of the changes from FIG. 1 to FIG. 2 involve reconfiguration of the interconnect structure only. None of the logic elements are reconfigured. This characteristic of the pictured embodiment can be an advantage, depending on the structure of the configuration bitstream. For example, in some Virtex PLDs reconfiguration of a logic element requires changes to several configuration data frames, while reconfiguring a portion of the interconnect structure can sometimes be accomplished by reloading only one or a few configuration data frames. Thus, the partial reconfiguration of the interconnect structure requires less time to perform than the partial reconfiguration of logic elements. (Note that in some embodiments the partial reconfiguration involves changes to portions of the programmable logic other than the interconnect structure. For example, in some embodiments, one or more of the logic elements are reconfigured.)

FIG. 3 illustrates a third configuration that can be created from the configuration of FIG. 2 by performing a second partial reconfiguration. The signal path of FIG. 2 has been severed between source logic element 101 and interconnect line 110b and between interconnect line 110b and destination logic element 102 (e.g., by disabling PIPs 104b and 106b). Programmable interconnections have also been added between source logic element 101 and interconnect line 110c and between interconnect line 110c and destination logic element 102 (e.g., by enabling PIPs 104c and 106c). Thus, the signal path now traverses interconnect line 110c instead of interconnect line 110b, as in FIG. 2. The new signal path can now be tested using a third test pattern.

Figure 4:
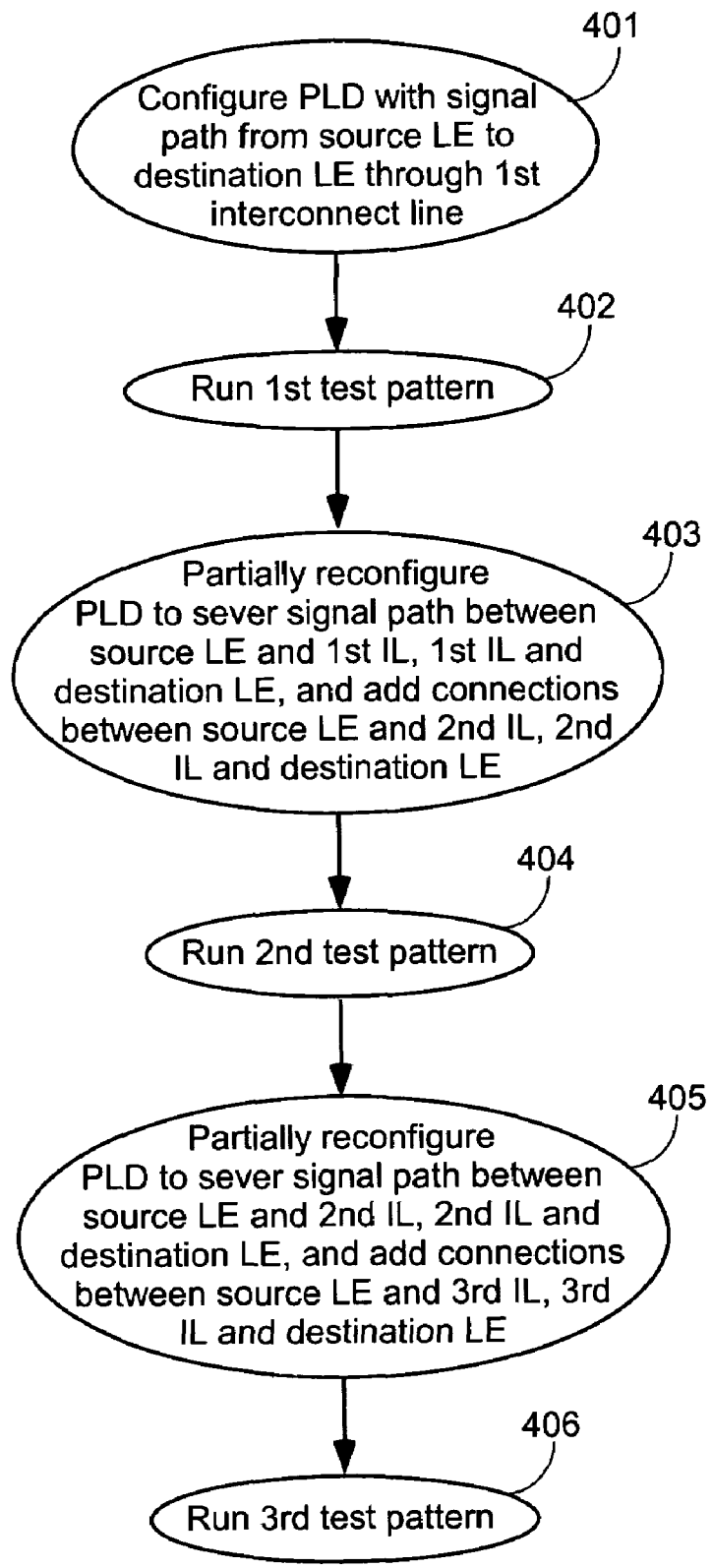
FIG. 4 illustrates the steps of a novel test method that can be used to produce the configurations of FIGS. 1–3.

FIG. 4 illustrates the steps of a method that can be used, for example, to provide the configurations of FIGS. 1–3, according to an embodiment of the present invention. The method is applied to a PLD that includes a source logic element, a destination logic element, and a plurality of interconnect lines programmably interconnecting the source and destination logic elements.

In step 401, the PLD is configured to implement a signal path from the source logic element to the destination logic element via a first interconnect line. In some embodiments, step 401 is performed as part of a full configuration procedure for the PLD. In step 402, a first test pattern is run on the PLD by providing a first test input signal to the source logic element and monitoring a resulting first test output signal from the destination logic element.

In step 403, the PLD is partially reconfigured to sever the signal path between the source logic element and the first interconnect line and between the first interconnect line and the destination logic element, and to add programmable interconnections between the source logic element and a second interconnect line and between the second interconnect line and the destination logic element.

In step 404, a second test pattern is run on the PLD by providing a second test input signal to the source logic element and monitoring a resulting second test output signal from the destination logic element. In some embodiments, the second test pattern is different from the first test pattern. For example, in some embodiments the partial reconfiguration of step 404 includes inserting an inversion on the signal path. Thus, the same input signal can be applied as in the first test pattern, but an inverted output signal will be detected at the output terminal.

Steps similar to steps 403–404 can now be repeated for additional interconnect lines. For example, in step 405 the PLD is partially reconfigured to sever the signal path between the source logic element and the second interconnect line and between the second interconnect line and the destination logic element, and to add programmable interconnections between the source logic element and a third interconnect line and between the third interconnect line and the destination logic element. In step 406, a third test pattern is applied to the new configuration resulting from step 405.

In some embodiments, the partial reconfiguration of step 405 includes removing the inversion previously added at step 403. Thus, the third test pattern results in an output signal that is the same as that resulting from the first test pattern, and the inverse of the output signal resulting from the second test pattern.

FIGS. 5–10 illustrate an example in which another aspect of the invention is applied to a particular group of logic in a Virtex FPGA from Xilinx, Inc. In this example, an interconnect line under test is driven by a plurality of programmable buffers that can also be tested using the described methods.

Figure 5:
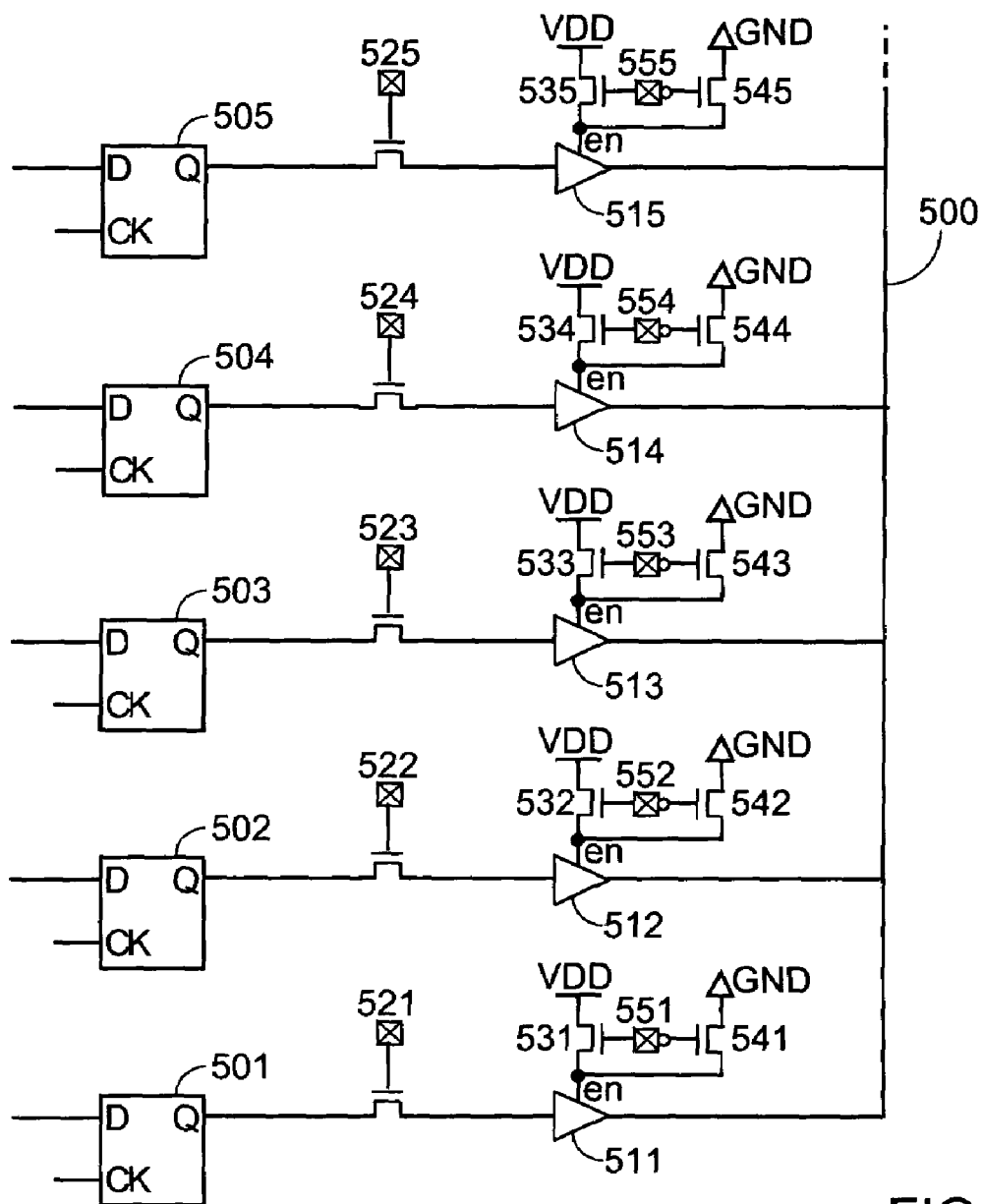
FIG. 5 illustrates a programmable interconnect line driven by programmable buffers in a known PLD.

FIG. 5 illustrates a small portion of the programmable logic included in a Virtex FPGA. The illustrated programmable logic portion is included in a column of logic blocks. A subset of the logic blocks (in this case, every sixth logic block) is capable of driving an interconnect line called a "long line", which extends along the column of logic blocks. Each logic block includes a programmable memory element and an associated programmable buffer. Each programmable memory element can be programmed to perform various functions, there is a programmable interconnect point (PIP) between each memory element and the associated buffer, and each buffer can be programmably enabled to drive the long line. Thus, the memory element in every sixth logic block can programmably drive the long line, while the buffers in the five intervening logic blocks are preferably disabled and their associated memory elements do not drive the long line.

The programmable logic portion shown in FIG. 5 includes memory elements 501–505, each driving an associated programmable buffer 511–515 via an associated PIP 521–525. In the configuration of FIG. 5, memory elements 501–505 are configured as registers (e.g., D-type flip-flops). Each of buffers 511–515 programmably drives a long line 500.

In the pictured embodiment, each buffer 511–515 is controlled by an associated configuration memory cell 551–555. A high value stored in the configuration memory cell enables a PIP 531–535 to power high VDD, providing a high value to an enable terminal "en" of the buffer. Thus, a high value stored in the memory cell 551–555 enables the associated buffer 511–515. A low value stored in the configuration memory cell enables a PIP 541–545 to power low GND, providing a low value to the enable terminal "en" of the buffer. Thus, a low value stored in the memory cell 551–555 disables the associated buffer 511–515.

The buffers illustrated in FIG. 5 and the illustrated circuits for enabling and disabling (tristating) the buffers are purely exemplary. In some embodiments, separate memory cells are used to control the connections to power high and ground. In some embodiments, other memory cells provide access to other interconnect lines in the interconnect structure, thereby allowing control of the buffer by user logic.

Figure 6:
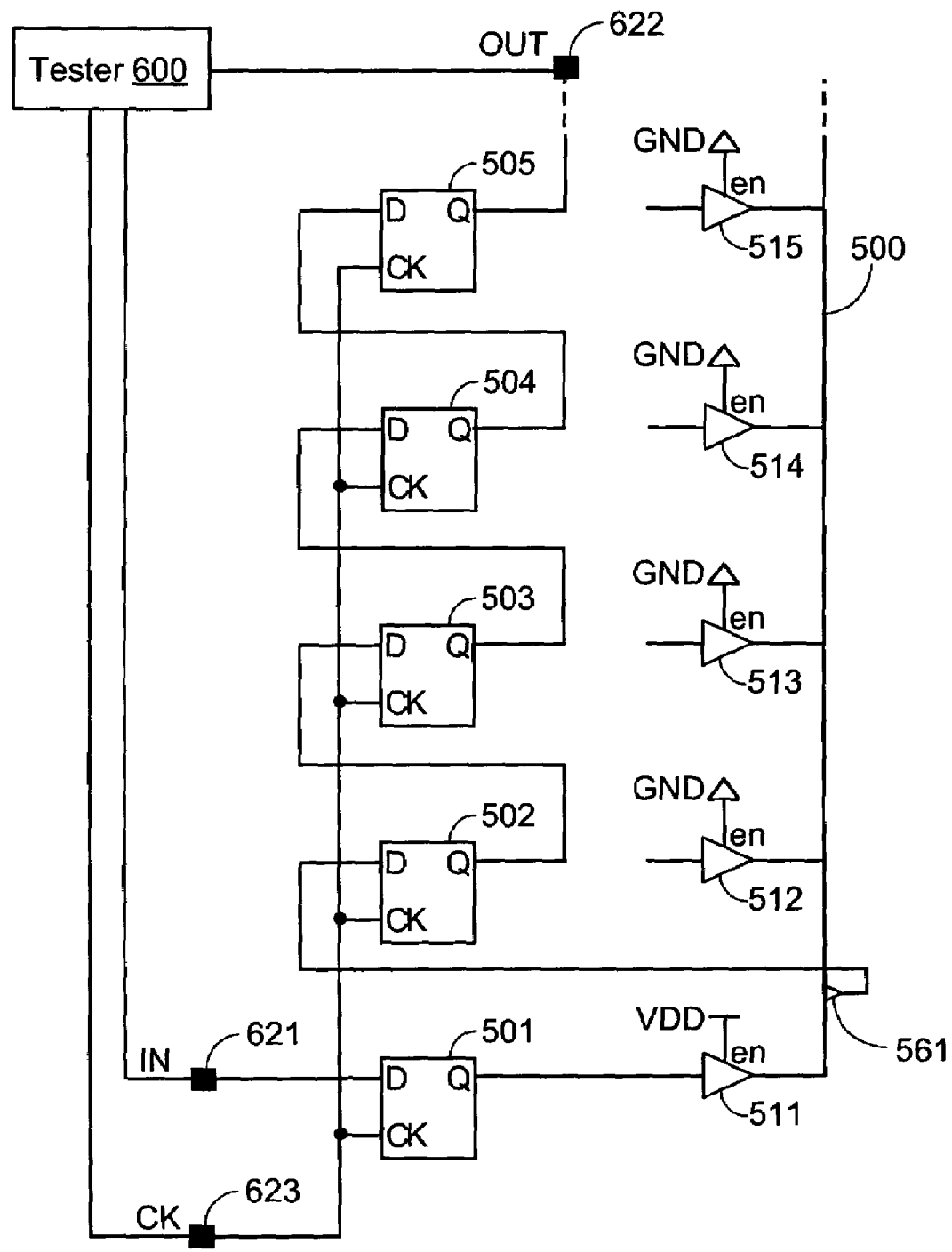
FIG. 6 illustrates a first configuration that can be programmed into a PLD as part of a novel test method.

To test the buffers and long line shown in FIG. 5, the PLD is configured with a first configuration as shown in FIG. 6. The first configuration creates a signal path that traverses, in order, an input terminal 621 (IN), a first memory element 501, a first buffer 511, the long line 500, a second memory element 502, the remaining memory elements 503–505, and an output terminal 622 (OUT). Input terminal 621 and output terminal 622 are accessible to a tester 600. A clock terminal 623 (CK) is also provided, and is coupled to both the tester 600 and the clock CK terminals of the memory elements 501–505.

In the configuration of FIG. 6, memory elements 501–505 are each configured to implement registers. Buffer 511 is enabled (the "en" terminal is coupled to VDD), while buffers 512–515 are each disabled (the "en" terminals are coupled to GND). Thus, only memory element 501 is driving long line 500, via buffer 511. The path between the long line 500 and the second memory element 502 is created in the illustrated embodiment by traversing a PIP 561. In other embodiments, PIP 561 includes a plurality of interconnect lines and PIPs.

The configuration shown in FIG. 6 provides a signal path that traverses each of the memory elements and also traverses the first buffer 511 and the long line 500. Thus, all of these elements can be tested by applying a first test pattern to terminals IN and CK and monitoring the output signal at terminal OUT. In one embodiment, the test input signal at terminal IN is first driven low, clocked, toggled from low to high, clocked, toggled back to a low value, and clocked again (pattern 0, 1, 0). Thus, it is verified that the signal transitions properly in both directions throughout the signal path.

To test buffers 512–515, the device must now be reconfigured so that the test signal path traverses these buffers, one at a time. (Clearly, two buffers cannot be enabled to drive long line 500 at the same time, or contention will occur on the long line.) Reconfiguring the entire PLD can take an extended period of time. Therefore, partial reconfiguration is used to alter the configuration of the device. Further, the number of configuration data frames to be reloaded is preferably kept to a minimum to shorten the amount of time required to perform the reconfiguration.

Figure 7:
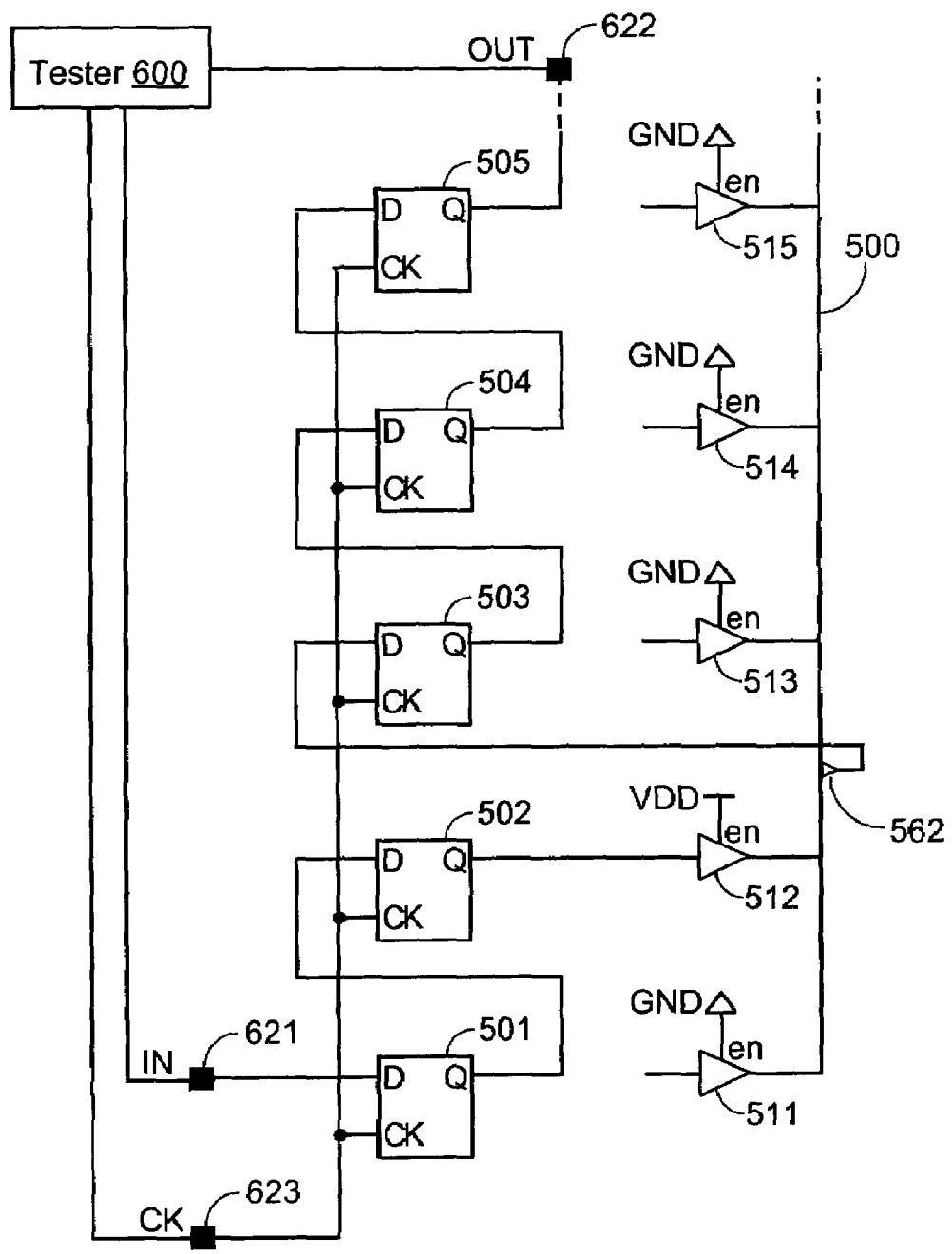
FIG. 7 illustrates a second configuration that can be programmed into a PLD as part of the novel test method.

FIG. 7 shows a second configuration that is achieved by performing a partial reconfiguration of the PLD, which is previously configured as shown in FIG. 6. The PLD is partially reconfigured to sever the signal path between long line 500 and second memory element 502, add a new signal path segment between memory elements 501 and 502, add a new signal path segment between long line 500 and third memory element 503, disable buffer 511, and enable buffer 512.

In the pictured embodiment, the connection between the first memory element 501 and the first buffer 511 is also severed. However, this change is optional, because the first buffer 511 is disabled and cannot drive long line 500. An advantage of severing this connection is that the loading on the signal path is reduced.

Note that all of the changes from FIG. 6 to FIG. 7 involve reconfiguration of the interconnect structure only. As previously described, this characteristic can provide an advantage by reducing the number of configuration data frames that must be reloaded during the partial reconfiguration. (Note that in some embodiments the partial reconfiguration involves changes to portions of the programmable logic other than the interconnect structure. For example, in some embodiments, one or more of the memory elements are reconfigured. In some embodiments, the buffers themselves must be reconfigured to enable and disable the buffers.)

The path between the long line 500 and the third memory element 503 is created in the illustrated embodiment by traversing a PIP 562. In other embodiments, PIP 562 actually consists of a plurality of interconnect lines and PIPs. Additionally, buffer 512 is enabled, while buffers 511 and 513–515 are each disabled. Thus, only memory element 502 is driving long line 500, via buffer 512.

The partial reconfiguration process in FPGAs is well known. Standard procedures can be followed to perform the partial reconfiguration that results in the embodiment of FIG. 6. For example, a shutdown command can be issued to the FPGA, halting operation of the design until after the partial reconfiguration is complete. As another example, input signals controlling the partial reconfiguration process should be held at known values throughout the process. An exemplary partial reconfiguration process for the Virtex family of FPGAs is described in the application note entitled "Two Flows for Partial Reconfiguration: Module Based or Small Bit Manipulations", also known as XAPP290 v1.0, published May 17, 2002 and available from Xilinx, Inc., which is hereby incorporated herein by reference.

The second buffer 512 can now be tested by applying a second test pattern to terminals IN and CK and monitoring the output signal at terminal OUT. In some embodiments, the two test patterns are the same. In other embodiments, the second test pattern is different from the first test pattern. For example, when performing the partial reconfiguration, the output terminal 622 can be reconfigured to perform an inversion (e.g., by including an inverter on the output path). Thus, the same input signal can be applied as in the first test pattern, but an inverted output signal will be detected at the output terminal. This alteration in the expected output values allows the tester to verify that the partial reconfiguration did in fact take place.

Figure 8:
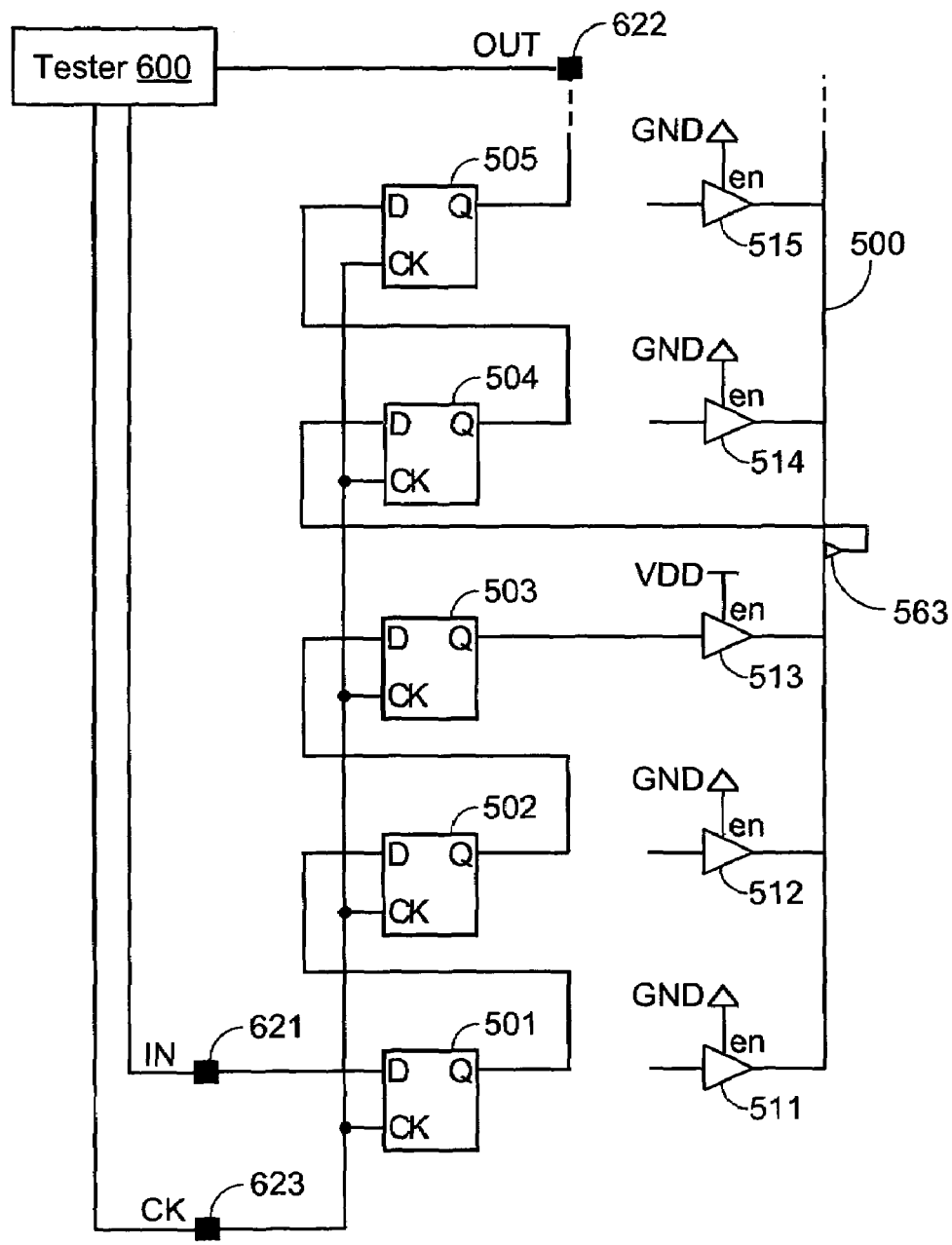
FIG. 8 illustrates a third configuration that can be programmed into a PLD as part of the novel test method.

FIG. 8 shows a third configuration that is achieved by performing a partial reconfiguration of the PLD previously configured as shown in FIG. 7. The PLD is partially reconfigured to sever the signal path between long line 500 and third memory element 503, add a new signal path segment between memory elements 502 and 503, add a new signal path segment between long line 500 and fourth memory element 504, disable buffer 512, and enable buffer 513.

Note that the path between the long line 500 and the fourth memory element 504 is created in the illustrated embodiment by traversing a PIP 563. In other embodiments, PIP 563 actually consists of a plurality of interconnect lines and PIPs. Additionally, buffer 513 is enabled, while buffers 511–512 and 514–515 are each disabled. Thus, only memory element 503 is driving long line 500, via buffer 513.

The third buffer 513 can now be tested by applying a third test pattern to terminals IN and CK and monitoring the output signal at terminal OUT. In some embodiments, the second partial reconfiguration includes removing the inversion previously added at the output terminal 622. Thus, the third test pattern results in an output signal that is the same as that resulting from the first test pattern, and the inverse of the output signal resulting from the second test pattern. Thus, the partial reconfiguration is verified along with the third buffer and the associated interconnect.

Figure 9:
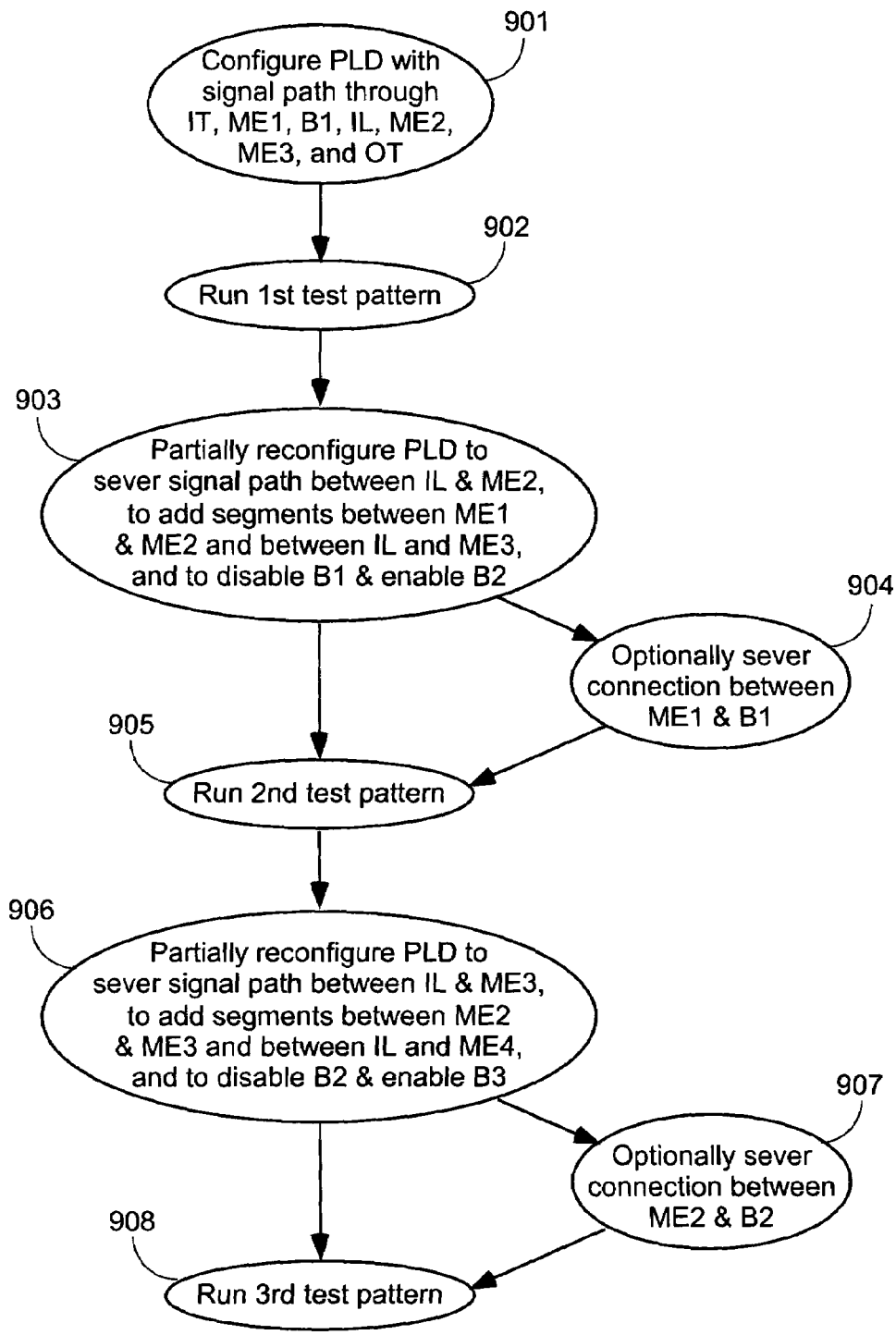
FIG. 9 illustrates the steps of a first novel test method that can be used to produce the configurations of FIGS. 6–8.

FIG. 9 illustrates the steps of a method of testing a PLD, according to one embodiment of the invention. The steps illustrated in FIG. 9 can be used, for example, to produce the configurations of FIGS. 6–8. The method is applied to a PLD that includes an interconnect line and at least three programmable buffers programmable driving the interconnect lines. The PLD also includes at least three memory elements associated with the three buffers.

In step 901, the PLD is configured with a first configuration that includes a signal path through an input terminal (IT), the first memory element (ME1), the first buffer (B1), the interconnect line (IL), the second memory element (ME2), the third memory element (ME3), and an output terminal (OT). In step 902, a first test pattern is run on the PLD configured in step 901.

In step 903, the PLD is partially reconfigured with a second configuration in which the signal path is severed between the interconnect line (IL) and the second memory element (ME2). Segments are added between the first and second memory elements (ME1 and ME2) and between the interconnect line (IL) and the third memory element (ME3). Finally, the first buffer (B1) is disabled and the second buffer (B2) is enabled. In optional step 904, the connection between the first memory element (ME1) and the first buffer (B1) is severed. In step 905, a second test pattern is run on the PLD configured in step 903 and (optionally) step 904.

In some embodiments, the second test pattern is different from the first test pattern. For example, in some embodiments the partial reconfiguration of step 903 includes inserting an inversion on the signal path. Thus, the same input signal can be applied as in the first test pattern, but an inverted output signal will be detected at the output terminal.

Steps similar to steps 903–905 can now be repeated for additional buffers programmably driving the interconnect line. In some embodiments, e.g., embodiments wherein the interconnect line is a long line, steps 903–905 can be repeated many times, moving along the long line and testing each buffer programmably driving the long line. Clearly, the more programmable buffers that can programmably drive the interconnect line, the more tester time is saved by applying the steps of the pictured method.

For example, in step 906 the PLD is partially reconfigured with a third configuration in which the signal path is severed between the interconnect line (IL) and the third memory element (ME3). Segments are added between the second and third memory elements (ME2 and ME3) and between the interconnect line (IL) and the fourth memory element (ME4). Finally, the second buffer (B2) is disabled and the third buffer (B3) is enabled. In optional step 907, the connection between the second memory element (ME2) and the second buffer (B2) is severed. In step 908, a third test pattern is run on the PLD configured in step 906 and (optionally) step 907.

In some embodiments, the partial reconfiguration of step 906 includes removing the inversion previously added at step 903. Thus, the third test pattern results in an output signal that is the same as that resulting from the first test pattern, and the inverse of the output signal resulting from the second test pattern.

Figure 10:
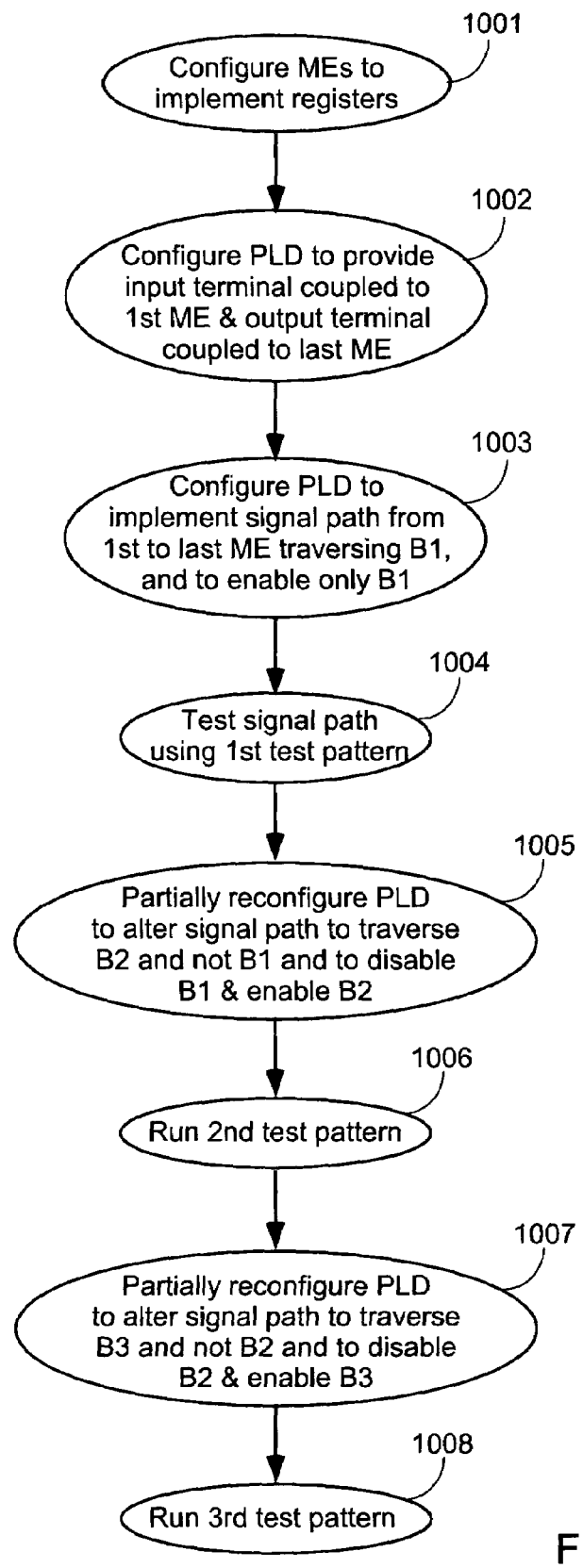
FIG. 10 illustrates the steps of a second novel test method that can be used to produce the configurations of FIGS. 6–8.

FIG. 10 illustrates the steps of another method of testing a PLD, according to another embodiment of the invention. The steps illustrated in FIG. 10 can be used, for example, to produce the configurations of FIGS. 6–8. The method is applied to a PLD that includes memory elements, programmable buffers, an associated interconnect line, and an interconnect structure programmably interconnecting the memory elements, buffers, and interconnect line.

In step 1001, the memory elements (MEs) are configured to implement registers. In step 1002, the PLD is configured to provide input and output terminals accessible to a tester. The input terminal is programmably coupled to a first one of the memory elements, and the output terminal is programmably coupled to a last one of the memory elements.

In step 1003, the interconnect structure is configured to implement a signal path that traverses each of the memory elements from the first memory element to the last memory element. The signal path also traverses a first buffer (B1), which is enabled. All other buffers capable of driving the interconnect line are disabled.

In some embodiments, steps 1001–1003 are all performed as part of a single full configuration procedure for the PLD. In other embodiments, one or more of the steps are performed as a partial reconfiguration.

In step 1004, the signal path is tested using a first test pattern.

In step 1005, the PLD is partially reconfigured to reconfigure the interconnect structure, altering the signal path to traverse the second buffer (B2) instead of the first buffer (B1). The PLD is also partially reconfigured to disable the first buffer (B1) and enable the second buffer (B2).

In step 1006, the signal path is tested again using a second test pattern. In some embodiments, the second test pattern is different from the first test pattern. For example, in some embodiments the partial reconfiguration of step 1005 includes inserting an inversion on the signal path. Thus, the same input signal can be applied as in the first test pattern, but an inverted output signal will be detected at the output terminal.

Steps similar to steps 1005–1006 can now be repeated for additional buffers programmably driving the interconnect line. In some embodiments, e.g., embodiments wherein the interconnect line is a long line, steps 1005–1006 can be repeated many times, moving along the long line and testing each buffer programmably driving the long line. Clearly, the more programmable buffers that can programmably drive the interconnect line, the more tester time is saved by applying the steps of the pictured method.

For example, in step 1007 the PLD is partially reconfigured to reconfigure the interconnect structure, altering the signal path to traverse the third buffer (B3) instead of the second buffer (B2). The PLD is also partially reconfigured to disable the second buffer (B2) and enable the third buffer (B3). In step 1008, a third test pattern is run on the PLD configured in step 1007.

In some embodiments, the partial reconfiguration of step 1007 includes removing the inversion previously added at step 1005. Thus, the third test pattern results in an output signal that is the same as that resulting from the first test pattern, and the inverse of the output signal resulting from the second test pattern.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the circuits and methods of the invention in the context of field programmable gate arrays (FPGAs) such as the Virtex family of FPGAs from Xilinx, Inc. However, the methods of the invention can also be implemented in other programmable logic devices having different device architectures and different programmable logic.

Further, interconnect lines, PIPs, buffers, programmable buffers, memory elements, configuration memory cells, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Accordingly, all such modifications and additions are deemed to be within the scope of the invention, which is to be limited only by the appended claims and their equivalents.

What is claimed is:

1. A method of testing a programmable logic device (PLD), the PLD comprising an interconnect line and programmable first, second, and third buffers each programmably driving the interconnect line, the PLD further comprising first, second, and third memory elements associated with the first, second, and third buffers, respectively, the method comprising:

configuring the PLD with a first configuration wherein a signal path is provided from an input terminal to the first memory element, the first buffer, the interconnect line, the second memory element, the third memory element, and an output terminal, in the stated order, and wherein the first buffer is enabled and the second and third buffers are disabled;

running a first test pattern on the PLD by applying a first test input signal to the input terminal and monitoring a resulting first test output signal on the output terminal;

partially reconfiguring the PLD with a second configuration wherein the signal path is severed between the interconnect line and the second memory element, wherein new segments are added to the signal path between the first memory element and the second memory element and between the interconnect line and the third memory element, and wherein the first buffer is disabled and the second buffer is enabled; and running a second test pattern on the PLD by applying a second test input signal to the input terminal and monitoring a resulting second test output signal on the output terminal.

2. The method of claim 1, wherein configuring the PLD with a first configuration comprises fully configuring the PLD.

3. The method of claim 1, wherein the first test pattern and the second test pattern are different.

4. The method of claim 3, wherein partially reconfiguring the PLD with a second configuration comprises inserting an inversion in the signal path.

5. The method of claim 1, wherein the PLD further comprises a programmable fourth buffer programmably driving the interconnect line and a fourth memory element associated with the fourth buffer, the method further comprising:

partially reconfiguring the PLD with a third configuration wherein the signal path is severed between the interconnect line and the third memory element, wherein new segments are added to the signal path between the second memory element and the third memory element and between the interconnect line and the fourth memory element, and wherein the second buffer is disabled and the third buffer is enabled; and running a third test pattern on the PLD by applying a third test input signal to the input terminal and monitoring a resulting third test output signal on the output terminal.

6. The method of claim 5, wherein the first and third test patterns are the same, and the second test pattern is different from the first and third test patterns.

7. The method of claim 6, wherein partially reconfiguring the PLD with a second configuration comprises inserting an inversion in the signal path, and partially reconfiguring the PLD with a third configuration comprises removing the inversion from the signal path.

8. A method of testing a programmable logic device (PLD) comprising memory elements, programmable buffers, an associated interconnect line, and an interconnect structure programmably interconnecting the memory elements, buffers, and interconnect line, the method comprising:

configuring the memory elements to implement registers;
configuring the PLD to provide input and output terminals accessible to a tester, the input terminal being programmably coupled to a first one of the memory elements and the output terminal being programmably coupled to a last one of the memory elements;

configuring the interconnect structure to implement a signal path traversing each of the memory elements from the first memory element to the last memory element and further traversing a programmable first buffer, and further to enable the first buffer to drive the interconnect line and disable all others of the buffers from driving the interconnect line;

testing the signal path using a first test pattern;
reconfiguring, using partial reconfiguration of the PLD, the interconnect structure to alter the signal path to traverse a programmable second buffer instead of traversing the first buffer and further to disable the first buffer from driving the interconnect line and enable the second buffer to drive the interconnect line; and testing the signal path using a second test pattern.

9. The method of claim 8, wherein the steps of configuring the memory elements, configuring the PLD to implement the signal path, and configuring the interconnect structure are all performed as part of a single full configuration procedure for the PLD.

10. The method of claim 8, wherein the first test pattern and the second test pattern are different.

11. The method of claim 10, wherein reconfiguring the interconnect structure to alter the signal path to traverse a programmable second buffer comprises inserting an inversion in the signal path.

12. The method of claim 8, further comprising:
reconfiguring, using partial reconfiguration of the PLD, the interconnect structure to alter the signal path to traverse a programmable third buffer instead of traversing the second buffer and further to disable the second buffer from driving the interconnect line and enable the third buffer to drive the interconnect line; and testing the signal path using a third test pattern.

13. The method of claim 12, wherein the first and third test patterns are the same and the second test pattern is different from the first and third test patterns.

14. The method of claim 13, wherein reconfiguring the interconnect structure to alter the signal path to traverse a programmable second buffer comprises inserting an inversion in the signal path, and reconfiguring the interconnect structure to alter the signal path to traverse a programmable third buffer comprises removing the inversion from the signal path.

15. A system, comprising:
a programmable logic device (PLD) comprising an interconnect line and programmable first, second, and third buffers each programmably driving the interconnect line, the PLD further comprising first, second, and third memory elements associated with the first, second, and third buffers, respectively; and a tester coupled to the PLD, the tester comprising:
means for configuring the PLD with a first configuration wherein a signal path is provided from an input terminal to the first memory element, the first buffer, the interconnect line, the second memory element, the third memory element, and an output terminal, in the stated order, and wherein the first buffer is enabled and the second and third buffers are disabled;

means for running a first test pattern on the PLD by applying a first test input signal to the input terminal and monitoring a resulting first test output signal on the output terminal;

means for partially reconfiguring the PLD with a second partial configuration wherein the signal path is severed between the first memory element and the first buffer and between the interconnect line and the second memory element, wherein new segments are added to the signal path between the first memory element and the second memory element and between the interconnect line and the third memory element, and wherein the first buffer is disabled and the second buffer is enabled; and means for running a second test pattern on the PLD by applying a second test input signal to the input terminal and monitoring a resulting second test output signal on the output terminal.

16. The system of claim 15, wherein configuring the PLD with a first configuration comprises fully configuring the PLD.

17. The system of claim 15, wherein the first test pattern and the second test pattern are different.

18. The system of claim 17, wherein the means for partially reconfiguring the PLD with a second configuration comprises means for inserting an inversion in the signal path.

19. The system of claim 15, wherein:
the PLD further comprises a programmable fourth buffer programmably driving the interconnect line and a fourth memory element associated with the fourth buffer; and
the tester further comprises:
means for partially reconfiguring the PLD with a third partial configuration wherein the signal path is severed between the second memory element and the second buffer and between the interconnect line and the third memory element, wherein new segments are added to the signal path between the second memory element and the third memory element and between the interconnect line and the fourth memory element, and wherein the second buffer is disabled and the third buffer is enabled; and
means for running a third test pattern on the PLD by applying a third test input signal to the input terminal and monitoring a resulting third test output signal on the output terminal.

20. The system of claim 19, wherein the first and third test patterns are the same, and the second test pattern is different from the first and third test patterns.

21. The system of claim 20, wherein the means for partially reconfiguring the PLD with a second configuration comprises means for inserting an inversion in the signal path, and the means for partially reconfiguring the PLD with a third configuration comprises means for removing the inversion from the signal path.

22. A system, comprising:
a programmable logic device (PLD) comprising memory elements, programmable buffers, an associated interconnect line, and an interconnect structure programmably interconnecting the memory elements, buffers, and interconnect line; and
a tester coupled to the PLD, the tester comprising:
means for configuring the memory elements to implement registers;
means for configuring the PLD to provide input and output terminals accessible to a tester, the input terminal being programmably coupled to a first one of the memory elements and the output terminal being programmably coupled to a last one of the memory elements;
means for configuring the interconnect structure to implement a signal path traversing each of the memory elements from the first memory element to the last memory element and further traversing a programmable first buffer, and further to enable the first buffer to drive the interconnect line and disable all others of the buffers from driving the interconnect line;
means for testing the signal path using a first test pattern;
means for reconfiguring, using partial reconfiguration of the PLD, the interconnect structure to alter the signal path to traverse a programmable second buffer instead of traversing the first buffer and further to disable the first buffer from driving the interconnect line and enable the second buffer to drive the interconnect line; and
means for testing the signal path using a second test pattern.

23. The system of claim 22, wherein the means for configuring the memory elements, the means for configuring the PLD to implement the signal path, and the means for configuring the interconnect structure together comprise a means for performing a single full configuration procedure for the PLD.

24. The system of claim 22, wherein the first test pattern and the second test pattern are different.

25. The system of claim 24, wherein the means for reconfiguring the interconnect structure to alter the signal path to traverse a programmable second buffer comprises means for inserting an inversion in the signal path.

26. The system of claim 22, wherein the tester further comprises:
means for reconfiguring, using partial reconfiguration of the PLD, the interconnect structure to alter the signal path to traverse a programmable third buffer instead of traversing the second buffer and further to disable the second buffer from driving the interconnect line and enable the third buffer to drive the interconnect line; and
means for testing the signal path using a third test pattern.

27. The system of claim 26, wherein the first and third test patterns are the same and the second test pattern is different from the first and third test patterns.

28. The system of claim 27, wherein the means for reconfiguring the interconnect structure to alter the signal path to traverse a programmable second buffer comprises means for inserting an inversion in the signal path, and the means for reconfiguring the interconnect structure to alter the signal path to traverse a programmable third buffer comprises means for removing the inversion from the signal path.

29. A method of testing a programmable logic device (PLD), the PLD comprising a source logic element, a destination logic element, and a plurality of interconnect lines programmably interconnecting the source and destination logic elements, the method comprising:
configuring the PLD with a first configuration wherein a signal path is provided from an output terminal of the source logic element to an input terminal of the destination logic element via a first interconnect line;
running a first test pattern on the PLD by providing a first test input signal to the source logic element and monitoring a resulting first test output signal from the destination logic element;
partially reconfiguring the PLD with a second configuration wherein the signal path is severed between the source logic element and the first interconnect line and between the first interconnect line and the destination logic element, and wherein programmable interconnections are added between the source logic element and a second interconnect line and between the second interconnect line and the destination logic element; and running a second test pattern on the PLD by providing a second test input signal to the source logic element and monitoring a resulting second test output signal from the destination logic element.

30. The method of claim 29, wherein partially reconfiguring the PLD with a second configuration comprises loading a minimum number of configuration data frames necessary to reroute the signal path through the second interconnect line instead of through the first interconnect line.

31. The method of claim 29, wherein the first configuration and the second configuration differ by a minimum number of configuration data bits necessary to reroute the signal path through the second interconnect line instead of through the first interconnect line.

32. The method of claim 29, wherein configuring the PLD with a first configuration comprises fully configuring the PLD.

33. The method of claim 29, wherein the first test pattern and the second test pattern are different.

34. The method of claim 33, wherein partially reconfiguring the PLD with a second configuration comprises inserting an inversion in the signal path.

35. The method of claim 29, further comprising:

partially reconfiguring the PLD with a third configuration wherein the signal path is severed between the source logic element and the second interconnect line and between the second interconnect line and the destination logic element, and wherein programmable interconnections are added between the source logic element and a third interconnect line and between the third interconnect line and the destination logic element; and running a third test pattern on the PLD by providing a third test input signal to the source logic element and monitoring a resulting third test output signal from the destination logic element.

36. The method of claim 35, wherein the first and third test patterns are the same, and the second test pattern is different from the first and third test patterns.

37. The method of claim 36, wherein partially reconfiguring the PLD with a second configuration comprises inserting an inversion in the signal path, and partially reconfiguring the PLD with a third configuration comprises removing the inversion from the signal path.

38. A system, comprising:

a programmable logic device (PLD) comprising a source logic element, a destination logic element, and a plurality of interconnect lines programmably interconnecting the source and destination logic elements; and a tester coupled to the PLD, the tester comprising:

means for configuring the PLD with a first configuration wherein a signal path is provided from an output terminal of the source logic element to an input terminal of the destination logic element via a first interconnect line;

means for running a first test pattern on the PLD by providing a first test input signal to the source logic element and monitoring a resulting first test output signal from the destination logic element;

means for partially reconfiguring the PLD with a second partial configuration wherein the signal path is severed between the source logic element and the first interconnect line and between the first interconnect line and the destination logic element, and wherein programmable interconnections are added between the source logic element and a second interconnect line and between the second interconnect line and the destination logic element; and means for running a second test pattern on the PLD by providing a second test input signal to the source logic element and monitoring a resulting second test output signal from the destination logic element.

39. The system of claim 38, wherein the means for partially reconfiguring the PLD with a second configuration comprises means for loading a minimum number of configuration data frames necessary to reroute the signal path through the second interconnect line instead of through the first interconnect line.

40. The system of claim 38, wherein the first configuration and the second configuration differ by a minimum number of configuration data bits necessary to reroute the signal path through the second interconnect line instead of through the first interconnect line.

41. The system of claim 38, wherein configuring the PLD with a first configuration comprises fully configuring the PLD.

42. The system of claim 38, wherein the first test pattern and the second test pattern are different.

43. The system of claim 42, wherein the means for partially reconfiguring the PLD with a second configuration comprises means for inserting an inversion in the signal path.

44. The system of claim 38, wherein the tester further comprises:

means for partially reconfiguring the PLD with a third partial configuration wherein the signal path is severed between the source logic element and the second interconnect line and between the second interconnect line and the destination logic element, and wherein programmable interconnections are added between the source logic element and a third interconnect line and between the third interconnect line and the destination logic element; and means for running a third test pattern on the PLD by providing a third test input signal to the source logic element and monitoring a resulting third test output signal from the destination logic element.

45. The system of claim 44, wherein the first and third test patterns are the same, and the second test pattern is different from the first and third test patterns.

46. The system of claim 45, wherein the means for partially reconfiguring the PLD with a second configuration comprises means for inserting an inversion in the signal path, and the means for partially reconfiguring the PLD with a third configuration comprises means for removing the inversion from the signal path.

* * * * *